(12) United States Patent
Robinson

(10) Patent No.: US 7,919,855 B2
(45) Date of Patent: Apr. 5, 2011

(54) TOPSIDE THERMAL MANAGEMENT OF SEMICONDUCTOR DEVICES USING BORON PHOSPHIDE CONTACTING A GATE TERMINAL

(75) Inventor: Kevin L. Robinson, Clay, NY (US)

(73) Assignee: Lockheed Martin, Bethesda, MD (US)

( * ) Notice: Subject to any disclaimer, the term of this patent is extended or adjusted under 35 U.S.C. 154(b) by 669 days.

(21) Appl. No.: 11/307,765

(22) Filed: Feb. 21, 2006

(65) Prior Publication Data

US 2007/0194384 A1     Aug. 23, 2007

(51) Int. Cl.
*H01L 23/373* (2006.01)
(52) U.S. Cl. .................. 257/713; 257/E23.11
(58) Field of Classification Search .......... 257/712, 257/713, E23.11, E23.111, E23.112, E23.113, 257/717, 718, 719, 720, E23.08, E23.101, 257/E23.106, E23.108
See application file for complete search history.

(56) References Cited

U.S. PATENT DOCUMENTS

| | | | |
|---|---|---|---|
| 5,250,327 A * | 10/1993 | Ogata et al. | 427/528 |
| 6,028,348 A * | 2/2000 | Hill | 257/666 |
| 6,396,864 B1 * | 5/2002 | O'Brien et al. | 372/49.01 |
| 6,646,293 B2 | 11/2003 | Emrick et al. | |
| 6,831,304 B2 | 12/2004 | Udagawa | |
| 6,894,312 B2 * | 5/2005 | Yamazaki et al. | 257/72 |
| 2007/0010049 A1 * | 1/2007 | Anderson et al. | 438/197 |

FOREIGN PATENT DOCUMENTS

| | | | |
|---|---|---|---|
| JP | 62008600 | * | 1/1987 |
| JP | 1243563 | * | 9/1989 |

OTHER PUBLICATIONS

Y.Kumashiro, Thermaophysical Properties of Boron Phosphide Single Crystalline Wafers, The Rigaku Journal—vol. 7/No. 1/ 1990.
Michael Ohadi, Ph.D, Thermal Management of Next Generation Low Volume Complex Electronics, Advanced Liquid Cooling.
Christopher Sanabria, et al.; A GaN Differential Oscillator with Improved Harmonic Performance, IEEE Microwave and Wireless Components Letters, vol. 15, No. 7 Jul. 2005.

(Continued)

*Primary Examiner* — Lynne A Gurley
*Assistant Examiner* — Andrew O Arena
(74) *Attorney, Agent, or Firm* — William Greener; George R. McGuire; Bond, Schoeneck & King, PLLC

(57) ABSTRACT

A semiconductor device including at least one gate terminal in operational contact with an active layer or top surface of the semiconductor substrate includes a deposited layer of boron phosphide covering the gate terminal and at least a portion of the active layer or the top surface next to and extending from the gate terminal. According to an aspect, the layer of boron phosphide is deposited by a chemical vapor deposition (CVD) process. The boron phosphide layer will have a thickness less than or equal to about 10 microns. The boron phosphide provides a heat spreading coating across the die surface, thus increasing the surface area that conducts the heat from the die. Since the boron phosphide coating is in intimate contact with the gate terminal(s) and the immediately adjacent passivation surfaces of the device, generated heat can rapidly spread away from the active junction or channel. The additional thermal path(s) provided by the boron phosphide coating may terminate away from the active region to further conduct away the heat through thermally unused areas of the device.

31 Claims, 3 Drawing Sheets

OTHER PUBLICATIONS

Egor Alekseev, et al. Broadband AlGaN/GaN HEMT MMIC Attenuators with High Dynamic Range.

Jim Wilson, Thermal Issus in GaAs Analog RF Devices, The Central Resource for Practitioners in the Field of Electronic Systems, pp. 1-9.

MMIC Semiconductor Tradeoffs- Microwave Encyclopedia—Microwaves 101.com pp. 1-8.

Packaging, Assembly, and Interconnects—Microwave Encyclopedia—Microwaves 101.com pp. 1-8.

A.N. Downey, Monolithic Microwave Integrated Circuits, pp. 74-88.

G.E. Ponchak, , pp. 170-180.

R.Shaw. pp. 1-5.

IMEC Improves GaN HEMT with ceramic substrates (Oct. 2005)—Compound Semiconductor Magazine, pp. 1-6.

* cited by examiner

TOPSIDE THERMAL MANAGEMENT OF SEMICONDUCTOR DEVICES USING BORON PHOSPHIDE CONTACTING A GATE TERMINAL

BACKGROUND OF THE INVENTION

1. Field of the Invention

Embodiments of the invention are generally directed to the field of semiconductors. More particularly, embodiments of the invention are directed to semiconductor devices having improved thermal characteristics and methods associated therewith. Most particularly, embodiments of the invention are directed (but not limited) to gallium nitride (GaN)-based monolithic microwave integrated circuits (MMICs) exhibiting improved heat dissipation and to methods for obtaining improved thermal performance from such devices.

2. Description of Related Art

MMICs are semiconductor devices that are increasingly being used in radar, communications, antenna and sensor applications, as well as others, which demand small size and high performance. Various semiconductor technologies have been developed over the past 30 years. Persons skilled in the art will recognize these technologies to include Field Effect Transistor (FET), high electron mobility transistor (HEMT) including pseudomorphic high electron mobility transistor (PHEMT) and metamorphic high electron mobility transistor (MHEMT), vertical PIN (VPIN) diode, and heterojunction bipolar transistor (HBT). These technologies have traditionally been based on the material properties of gallium arsenide (GaAs), silicon (Si), silicon carbide (SiC), silicon germanium (SiGe), and indium phosphide (InP), for example.

New semiconductor materials and semiconductor/substrate combinations continue to be sought for higher frequency operation, greater power density handling capability, higher operating voltage/lower current operation, improved operational efficiency, operation under more demanding operating conditions (e.g., heat load), and other reasons. Currently, gallium nitride (GaN) and aluminum-gallium nitride (AlGaN)-based semiconductors are receiving considerable attention. They have demonstrated greater power handling capacity and improved, measured performance parameters over the more traditional technologies referred to above. For a general discussion on MMICs and more focused disclosure on GaN and AlGaN-based MMICs, the interested reader is referred to the following resources, the disclosures of which are hereby incorporated by reference in their entireties to the fullest extent allowed by applicable laws and rules: Kayali et al., *GaAs MMIC Reliability Assurance Guideline for Space Applications* (Dec. 15, 1996) at http://parts.jpl.nasa.gov/mmic/contents.htm; M. Germain, *IMEC improves GaN HEMTs with ceramic substrates*, (October 2005) at http://www.compoundsemiconductor.net/articles/magazine/11/10/2/1; *MMIC semiconductor tradeoffs* at http://www.microwaves101.com/encyclopedia/MMICsemi.cfm, Alekseev et al., *Broadband AlGaN/GaN HEMT MMIC Attenuators with High Dynamic Range*, 30th European Microwave Conference (GMS) (2000) at http://www.eecs.umich.edu/dp-group/GAN/emw2000.pdf, Sanabria et al., *A GaN Differential Oscillator With Improved Harmonic Performance*, IEEE Microwave And Wireless Components Letters, 15, 7, pp 463-465 (July 2005).

Reports in the literature predict that by 2007, a typical microprocessor of about 1 $cm^2$ will contain over one billion transistors. The higher operating frequency and power handling capability of current and prospective semiconductor devices, e.g., GaN-based MMICs, combined with an ever increasing packaging density, minimization constraints and reliability demands are driving the need for more efficient thermal management. A discussion of challenges and solutions pertaining to thermal issues of semiconductor devices is disclosed in Wilson, *Thermal Issues in GaAs Analog RF Devices* at http://www.electronics-cooling.com/html/2002_february_a1.html. An overview of semiconductor cooling concepts and implementation is presented in Ohadi, *Thermal Management of Next Generation Low Volume Complex Electronics* (May 13, 2003) at http://www.vita.com/cool/pres/0845-Ohadi.pdf. The disclosures of both of these references are hereby incorporated by reference in their entireties.

One exemplary thermal management solution includes the chemical vapor deposition of a thin diamond layer on the semiconductor substrate to increase thermal conductivity. Another known solution involves the construction of air bridges over gate and drain terminals, providing double sided cooling and thermal paths to separate heat sink locations. These approaches have met with varying degrees of success. For example, the air bridges are thermally far removed from the heat dissipating area of the die, which limits the effect of additional topside heat sinking. In any event, current approaches do not yet offer optimum thermal management, while the demands increase literally daily.

In view of the foregoing, the inventor has recognized a need for improvement in the thermal management of semiconductor devices, particularly GaN-based MMICs (but not excluding others). The improvements offered by the embodiments of the invention will contribute to advancing the packaging, performance, reliability, application, cost and other principal considerations of new generation semiconductor materials, devices and processes.

SUMMARY OF THE INVENTION

Embodiments of the invention are directed to semiconductor devices having structural features that provide improved thermal management (e.g., heat dissipation), and to methods for obtaining improved thermal management in such devices. MMICs will be disclosed as illustrative embodiments of the invention, however, a person skilled in the art will appreciate that these illustrative embodiments are not intended to limit the invention to this particular type of device.

An embodiment of the invention is directed to a semiconductor device that includes a substrate having a top surface, a bottom surface and a plurality of side surfaces, and at least one gate terminal in operational contact with an active (epitaxial) layer of the semiconductor device or the top surface of the substrate; and a layer of boron phosphide covering at least one gate terminal and at least a portion of either the active layer or the top surface immediately adjacent the gate terminal. According to an aspect, a chemical vapor deposition (CVD) deposited layer of boron phosphide will have a thickness less than or equal to about 10 microns. More particularly, the thickness of the deposited layer of boron phosphide will be in the range between about 10 Angstroms to 10 microns. The boron phosphide provides a heat spreading coating across the die surface, thus increasing the surface area that conducts the heat from the die. Since the boron phosphide coating is in intimate contact with the gate terminal(s) and the immediately adjacent passivation surfaces of the device, generated heat can rapidly spread away from the active junction or channel. The additional thermal path(s) provided by the boron phosphide coating may terminate away from the active region to further conduct away the heat through thermally unused areas of the device. Device embodiments may be based on GaN, aluminum nitride (AlN), aluminum gallium nitride (AlGaN), gallium arsenide (GaAs), aluminum gallium arsenide (AlGaAs), indium gallium arsenide (InGaAs), indium phosphide (InP), and other suitable semiconductor materials known in the art. Illustrative semiconductor device substrates include silicon (Si), silicon carbide (SiC), GaAs, Sapphire, AlN, ceramic AlN and other suitable substrate materials known in the art. Exemplary MMIC technologies include FET, PHEMT, MHEMT, HEMT and HBT.

Another embodiment of the invention is directed to a method for dissipating heat generated by a semiconductor device. The method involves providing a semiconductor device including a substrate having a top surface, and at least one gate terminal in operational contact with an active layer of the semiconductor device or the top surface of the substrate; and depositing a layer of boron phosphide covering at least one of the gate terminals and at least a portion of the active layer or the top surface immediately adjacent the gate terminal. In an aspect, the boron phosphide coating is deposited by a chemical vapor deposition method. The use of boron phosphide is compatible with semiconductor processing at low temperatures; i.e., less than or equal to about 500° C. According to an aspect, the boron phosphide coating is deposited to a thickness of 10 microns or less, and more particularly, in the range between about 10 Angstroms to 10 microns.

The objects and advantages mentioned herein above, as well as others, will be apparent to those skilled in the art in view of the figures and detailed description which follow and as defined in the appended claims.

DETAILED DESCRIPTION OF EMBODIMENTS OF THE INVENTION

Figure 1:
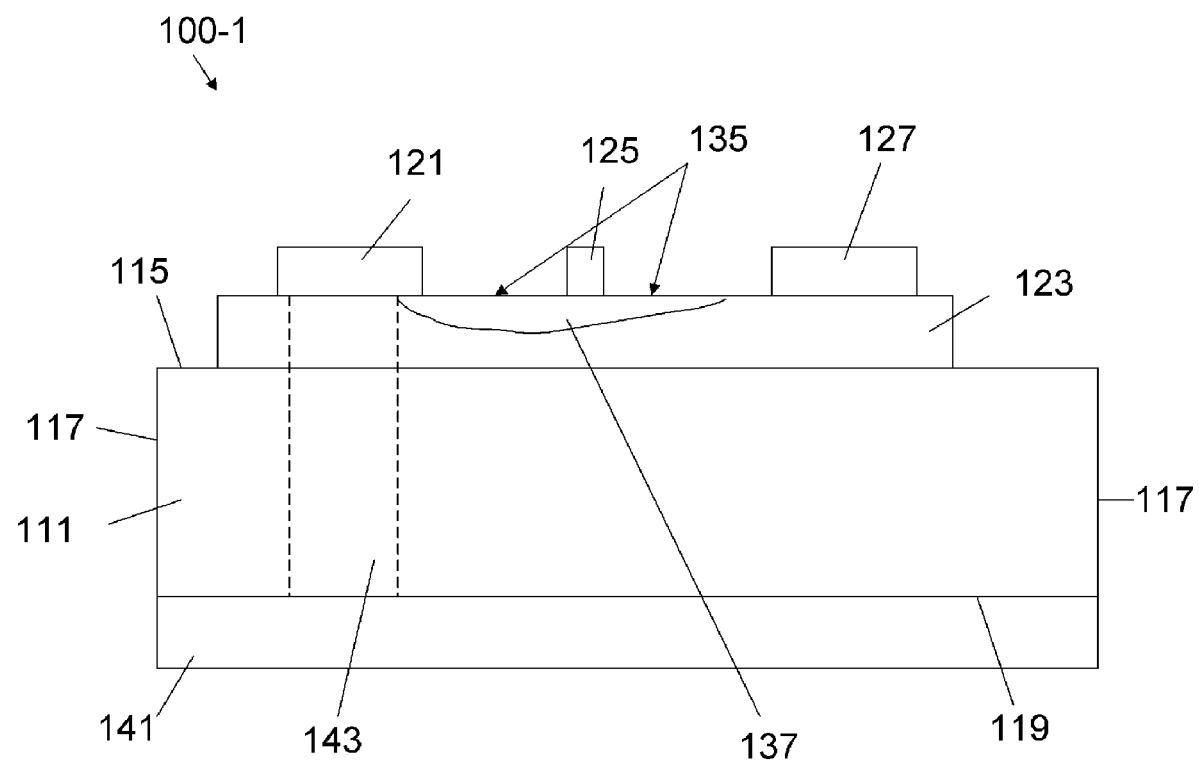
FIG. 1 is a schematic cross sectional block view of a prior art FET semiconductor device illustrating the basic geometry of such a device.

Embodiments of the invention are directed to semiconductor devices having novel structural features that provide improved, topside thermal management, and to methods for obtaining semiconductor devices exhibiting improved, topside thermal management. Illustrative and exemplary embodiments of the invention will now be described with reference to the drawings. Like reference numerals will be used for like features in the drawing figures whenever appropriate. Although embodiments of the invention may be described and/or illustrated with respect to a particular type of semiconductor device such as, e.g., a FET or MMIC, the invention is not intended to be so limited.

FIG. 1 presents a cross sectional length-wise view of an illustrative (prior art) FET semiconductor device 100-1. The figure is presented to illustrate the basic structural features of a semiconductor device so that the reader may have a clearer understanding of the embodiments according to the invention. The semiconductor device 100-1 includes a semiconductor substrate 111 having a top surface 115, side surfaces 117 and a bottom surface 119. As shown, a back plane 141 or other back-side feature is located immediately adjacent the bottom surface of the substrate. The device 100-1 has an active epitaxial layer 123 immediately adjacent the top surface 115 of the device. A depletion region 137 is illustrated in the active layer. The device 100-1 has a source 121, a drain 127 and a gate (or gate finger or gate terminal) 125 located intermediate the source 121 and the drain 127. Other illustrative devices may or may not have an active region 123 as shown in FIG. 1. The source, gate and drain terminals may thus appear to be in contact with the substrate surface 115 rather than as shown. Reference 143 is intended to illustrate a plated via hole between the source 121 and the back plane 141. A person skilled in the art will appreciate that the device 100-1 could contain millions or more components each having a source, gate and drain as illustrated in FIG. 1. Reference numeral 135 represents the surface area of the active layer immediately adjacent and extending from each side of the gate 125.

An exemplary semiconductor device 100-1 is a MMIC. MMICs can be based on a number of semiconductor materials including, but not limited to, InP, InGaAs, AlGaAs, GaAs, AlGaN, AlN, GaN, combinations thereof and other materials known in the art. Exemplary semiconductor substrate materials include Si, SiC, GaAs, sapphire, AlN, ceramic AlN and other semiconductor materials known in the art. Embodiments of the invention are particularly but not exclusively of benefit to GaN-based devices due to their greater power handling capacity than more conventional based material devices. Embodiments according to the invention are advantageously directed to prospective GaN MMIC devices that operate at power densities above 5 watts per millimeter, as well as with devices operating at lower power densities.

Figures 2A, 2B:
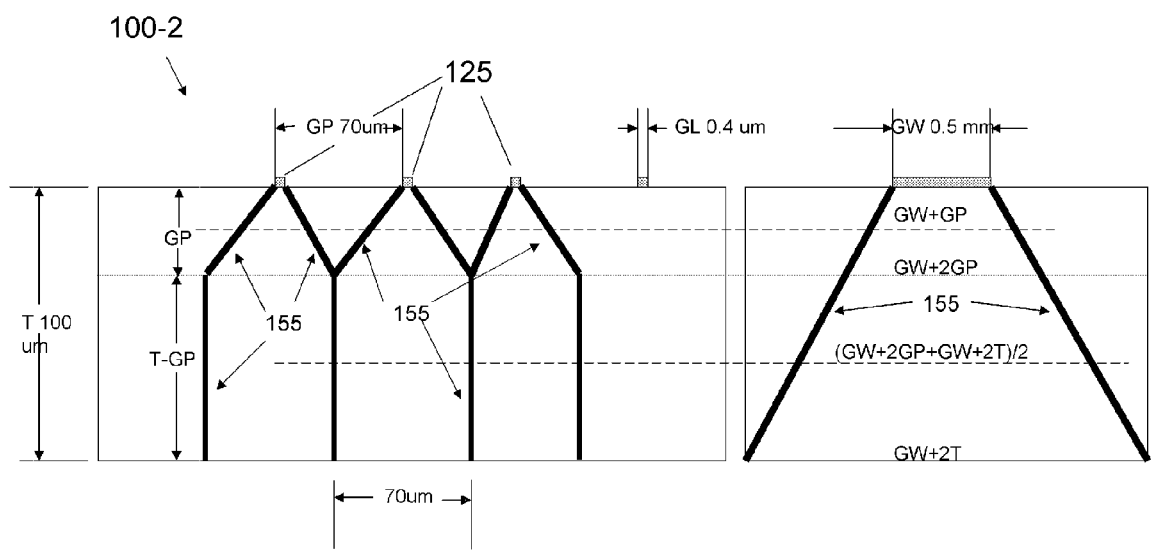
FIG. 2A is a schematic cross sectional line drawing of a multi-gate semiconductor device illustrating the conventional thermal paths in a typical device.
FIG. 2B is side view along a gate finger of the illustration in FIG. 2A.

FIG. 2A shows a cross sectional length-wise view of an illustrative MMIC 100-2 with multiple gate terminals 125, having a gate pitch (GP) equal to 70 microns. Each gate terminal has a gate length (GL) equal to 0.4 microns and a gate width (GW) equal to 0.5 millimeters as shown in FIG. 2B. FIG. 2B is a cross-sectional side view of the device 100-2 illustrated in FIG. 2A. The device as shown has a device thickness T equal to 100 microns. Various dimensional regions of the device 100-2 are designated as GP (gate pitch), T−GP (thickness minus gate pitch), GW+GP (gate width plus gate pitch), GW+2GP (gate width plus 2× gate pitch), GW+2GP+GW+2T/2 (gate width plus 2× gate pitch plus gate width plus 2× thickness divided by 2), and GW+2T (gate width plus 2× thickness) as shown in FIGS. 2A and 2B. The bold lines designated by reference numeral 155 schematically illustrate conventional thermal paths for heat dissipation in a device not cooled according to the embodiments of the invention.

According to an embodiment of the invention, a topside layer of Boron Phosphide provides improved thermal conduction paths in a semiconductor device. Boron phosphide is an attractive material for this application due to its tailorable and demonstrated thermal conductivity attributes as well as its compatibility with semiconductor substrate materials. The interested reader is directed to Kumashire, *Thermophysical Properties of Boron Phosphide Single Crystalline Wafers*, The Rigaku Journal, 7, 1, pp. 21-26 (1990), the entire contents of which are hereby incorporated by reference. Table 1 below lists the thermal conductivity values of boron phosphide and several other common semiconductor materials for comparison.

TABLE 1

| Material | Thermal Conductivity |
|---|---|
| Gallium Arsenide | 0.39 W/cm-deg C. |
| Silicon | 1.3 |
| Aluminum Nitride | 1.7 |
| Silicon Carbide | 2.7 |
| Sapphire | 0.47 |
| Boron Phosphide | 0.004-4 |

Figures 3A, 3B:
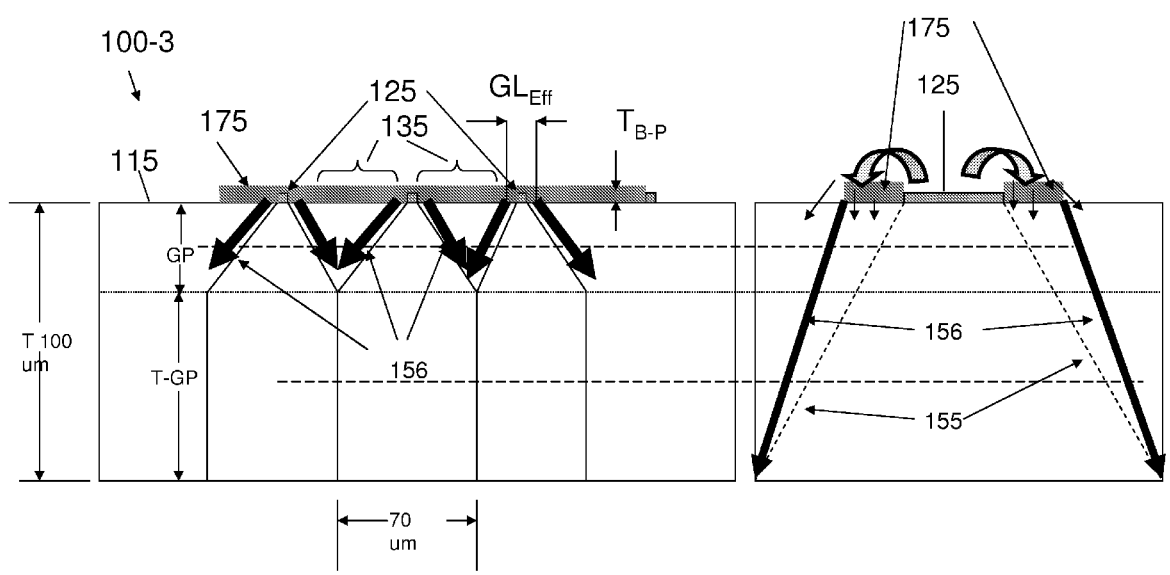
FIG. 3A is a schematic cross sectional line drawing of a multi-gate semiconductor device as shown in FIG. 2A illustrating the improved thermal paths provided according to an embodiment of the invention.
FIG. 3B is side view along a gate terminal of the illustration in FIG. 3A.

As illustrated in FIGS. 3A and 3B, MMIC device 100-3 has a coating layer of boron phosphide 175 that covers the gate terminal 125 and at least a portion of the surface of the active layer 135 or the surface of 115 of the substrate 111 immediately adjacent the sides of the gate terminal (see FIG. 1) and extending outwardly therefrom. As shown in the exemplary embodiment of FIG. 3A, the boron phosphide coating 175 extends over three gate terminals 125, between these terminals and on the device surface adjacent the other sides of at least two gate terminals. According to an exemplary embodiment, the boron phosphide coating 175 has a thickness $T_{B-P}$ up to about 10 microns. In an exemplary aspect, the boron phosphide coating 175 has a thickness in a range between about 10 angstroms to 10 microns. The intimate contact of the boron phosphide coating 175 with the metal gate terminals 125 provides additional surface area for heat conduction as shown by the bolded arrows 156. The additional surface area for heat conduction allows more parallel paths for heat flow through the thickness of the MMIC up to the point where thermal mixing occurs. The additional heat paths further allow effective heat spreading as close to the active junction or channel of the device as possible. In essence, the gate length, GL (see FIG. 2A), of the gate terminal is effectively increased to the value $GL_{EFF}$ as shown in FIG. 3A. The greater effective gate length dissipates heat more efficiently than the actual gate length GL.

The following examples illustrate thermal management improvement according to embodiments of the invention. The calculations pertain to transmit modules having the listed parameters.

Example 1a

Baseline Thermal Impedance in SiC Substrate with 10 W/mm Output

| Output Stage | |
|---|---|
| Output Power density | 10 W/mm |
| Gate Width | 0.5 mm |
| Gate Pitch | 0.07 mm |
| Gate Length | 0.0004 mm |
| Heatsink Temp | 100 deg C. |
| Chip thickness | 0.1 mm |
| Calibration temp | 25 deg C. |
| Gain drift | −0.015 dB/deg C. |
| ss gain | 9.5 dB |
| Gain Compression | 2 dB |
| efficiency | 65% |
| Thermal conductivity | 0.268 w/mm-deg C. |
| Theta Chip | 15.3 deg C./W |
| Single Gate PD | 3.84 W |
| Delta T chip | 58.9 deg C. |
| T chip | 158.9 deg C. |
| Gain correction | −1.125 |
| Input power density | 2.30 W/mm |

Note that the gate length is equal to 0.0004 mm and the calculated chip temperature $T_{chip}$ equal to 158.9° C.

Example 1b

Improved Thermal Impedance in SiC Substrate with 10 W/mm Output

| Output Stage | |
|---|---|
| output power density | 10 W/mm |
| Gate Width | 0.5 mm |
| Gate pitch | 0.07 mm |
| Eff. Gate Length | 0.0354 mm |
| Heatsink Temp | 100 deg C. |
| Chip thickness | 0.1 mm |
| Calibration temp | 25 deg C. |
| Gain drift | −0.015 deg C. |
| ss gain | 9.5 dB |
| gain compression | 2 dB |
| efficiency | 65% |
| Thermal conductivity | 0.268 w/mm deg C. |
| Theta chip | 8.90 deg C./W |
| Single gate PD | 3.84 W |
| Delta T chip | 34.2 deg C. |
| T chip | 134.2 deg C. |
| Gain correction | −1.125 |
| Input power density | 2.30 W/mm |

The effective gate length $GL_{EFF}$ increased to 0.0354 mm from the actual gate length GL of 0.0004 mm (Example 1a) due to the simulated boron phosphide coating as illustrated in FIG. 3A. The calculated chip temperature $T_{chip}$ became 134.2° C. The thermal improvement, expressed as the difference in the chip temperatures, was about 25° C.

Example 2a

Baseline Thermal Impedance in GaAs Substrate with 0.7 W/mm Output

| Output Stage | |
|---|---|
| output power Density | 0.7 W/mm |
| Gate Width | 0.5 mm |
| Gate pitch | 0.032 mm |
| Gate Length | 0.0005 mm |
| Heatsink Temp | 80 deg C. |
| Chip thickness | 0.1 mm |
| Calibration temp | 25 deg C. |
| Gain drift | −0.015 dB/deg C. |
| ss gain | 11 dB |
| gain compression | 4 dB |
| efficiency | 52% |
| Thermal conductivity | 0.04 w/mm-deg C. |
| Theta chip | 175.2 deg C./W |
| Single gate PD | 0.408 W |
| Delta T chip | 71.4 deg C. |

-continued

| Output Stage | |
|---|---|
| T chip | 151.4 deg C. |
| Gain correction | −0.825 |
| input power density | 0.169 W/mm |

Note the actual gate length equal to 0.0005 mm and the chip temperature equal to 151.4° C.

Example 2b

Improved Thermal Impedance in GaAs Substrate with 0.7 W/mm Output

| Output Stage | |
|---|---|
| output power density | 0.7 W/mm |
| Gate Width | 0.5 mm |
| Gate pitch | 0.032 mm |
| Eff. Gate Length | 0.0165 mm |
| Heatsink Temp | 80 deg C. |
| Chip thickness | 0.1 mm |
| Calibration temp | 25 deg C. |
| Gain drift | −0.015 dB/deg C. |
| ss gain | 11 dB |
| gain compression | 4 dB |
| efficiency | 52% |
| thermal conductivity | 0.04 W/mm-deg C. |
| Theta chip | 130. deg C./W |
| Single gate PD | 0.408 W |
| Delta T chip | 53.1 deg C. |
| T chip | 133.1 deg C. |
| Gain correction | −0.825 |
| input power density | 0.17 W/mm |

Note that the effective gate length has increased to 0.0165 mm. The chip temperature $T_{chip}$ is equal to 133.1° C. The calculated thermal improvement is equal to about 18° C.

Other embodiments of the invention are directed to methods for creating improved heat dissipating paths and providing better thermal management for semiconductor devices. The methods involve depositing a topside layer of boron phosphide to the device covering at least some of the gate terminals and portions of either the active layer or the top surface of the semiconductor substrate next to and extending from the gate terminals. In an exemplary process, the layer of boron phosphide is deposited by a chemical vapor deposition process at a temperature less than or equal to about 500° C. The boron phosphide is deposited in a thickness less than about 10 microns; more particularly, the thickness is between about 10 Angstroms to 10 microns.

The foregoing description of the embodiments of the invention have been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A semiconductor device, comprising:
   a substrate having a top surface, a bottom surface and a plurality of side surfaces;
   a gate terminal interconnected to a top-side of the device; and
   a layer of boron phosphide in direct contact with at least a portion of the top-side of the device and in direct contact with and entirely covering the gate terminal,
   wherein the device is characterized by a cooling path through the substrate and the top side.

2. The semiconductor device of claim 1, wherein the layer of boron phosphide has a thickness less than or equal to about 10 microns.

3. The semiconductor device of claim 2, wherein the thickness of the deposited layer of boron phosphide is in the range between about 10 Angstroms to 10 microns.

4. The semiconductor device of claim 2, including a plurality of gate terminals, wherein the layer of boron phosphide is in direct contact with at least two adjacent gate terminals.

5. The semiconductor device of claim 4, wherein the semiconductor device is a monolithic microwave integrated circuit (MMIC).

6. The semiconductor device of claim 4, wherein the semiconductor device is of a system-in-a-package construction.

7. The semiconductor device of claim 6, wherein the system-in-a-package construction includes a multi-chip module.

8. The semiconductor device of claim 5, wherein the MMIC is one of a GaN, AlN, AlGaN, GaAs, AlGaAs, InGaAs, InP, and combinations thereof-based semiconductor device.

9. The semiconductor device of claim 8, further comprising a protective layer.

10. The semiconductor device of claim 9, wherein the protective layer comprises $SiO_2$.

11. The semiconductor device of claim 5, wherein the MMIC comprises a Si substrate.

12. The semiconductor device of claim 5, wherein the MMIC comprises a SiC substrate.

13. The semiconductor device of claim 5, wherein the MMIC comprises a GaAs substrate.

14. The semiconductor device of claim 5, wherein the MMIC comprises a Sapphire substrate.

15. The semiconductor device of claim 5, wherein the MMIC comprises an aluminum nitride (AlN) substrate.

16. The semiconductor device of claim 15, wherein the MMIC comprises a ceramic aluminum nitride (AlN) substrate.

17. The semiconductor device of claim 5, wherein the MMIC is one of a FET, PHEMT, MHEMT, HEMT, HBT.

18. The semiconductor device of claim 1, further comprising an active layer positioned between the gate terminal and the top surface of the substrate.

19. A method for dissipating heat in a semiconductor device, comprising:
   providing a semiconductor device including a substrate having a top surface, and a top-side gate terminal interconnected to the substrate on a top side of the device;
   depositing a layer of boron phosphide on the device in direct contact with at least a portion of the top-side of the device and in direct contact with and entirely covering the gate terminal,
   thereby forming a cooling path through the substrate and the top side.

20. The method of claim 19, further comprising depositing the layer of boron phosphide having a thickness less than or equal to about 10 microns.

21. The method of claim 20, further comprising depositing the layer of boron phosphide with a thickness in the range between about 10 Angstroms to 10 microns.

22. The method of claim 20, wherein the semiconductor device includes a plurality of gate terminals, further wherein the deposited layer of boron phosphide covers at least two adjacent gate terminals.

23. The method of claim 20, wherein the layer of boron phosphide is deposited by a chemical vapor deposition process.

24. The method of claim 20, comprising depositing the layer of boron phosphide at a temperature less than or equal to about 500° C.

25. The method of claim 19, comprising the further step of providing an active layer on the substrate prior to the step of depositing a layer of boron phosphide to the device in covering relation to the gate terminal.

26. A method for providing an improved heat flow path for a monolithic microwave integrated circuit (MMIC) including a substrate having a top surface, and a gate terminal in operational contact with at least one of an active layer of the MMIC adjacent the top surface and the top surface of the substrate, comprising:

depositing a layer of boron phosphide on the MMIC, wherein the layer of boron phosphide is in direct contact with and entirely covering the gate terminal.

27. The method of claim 26, comprising depositing the layer of boron phosphide having a thickness less than or equal to about 10 microns.

28. The method of claim 27, wherein the thickness of the deposited layer of boron phosphide is in the range between about 10 Angstroms to 10 microns.

29. The method of claim 27, wherein the MMIC includes a plurality of gate terminals, further wherein the deposited layer of boron phosphide covers at least two adjacent gate terminals.

30. The method of claim 26, comprising depositing the layer of boron phosphide at a temperature less than or equal to about 500° C.

31. The method of claim 30, comprising depositing the layer of boron phosphide by chemical vapor deposition.

* * * * *